United States Patent
Fournel

(10) Patent No.: US 6,498,509 B2
(45) Date of Patent: Dec. 24, 2002

(54) DEVICE TO CONTROL THE POWER SUPPLY IN AN INTEGRATED CIRCUIT COMPRISING ELECTRICALLY PROGRAMMABLE NON-VOLATILE MEMORY ELEMENTS

(75) Inventor: Richard Fournel, Lumbin (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/896,817

(22) Filed: Jun. 29, 2001

(65) Prior Publication Data

US 2002/0018367 A1 Feb. 14, 2002

(30) Foreign Application Priority Data

Jun. 30, 2000 (FR) .............................................. 0008548

(51) Int. Cl.$^7$ ................................................ G06F 7/38
(52) U.S. Cl. .............................. 326/37; 326/80; 326/81
(58) Field of Search .............................. 326/37, 38, 47, 326/80, 81; 365/185.25, 185.28, 185.29, 230.06

(56) References Cited

U.S. PATENT DOCUMENTS

| | | | |
|---|---|---|---|
| 4,694,430 A | 9/1987 | Rosier | 365/189 |
| 4,835,423 A | 5/1989 | de Ferron et al. | 307/584 |
| 4,837,744 A | 6/1989 | Marquot | 365/195 |
| 5,293,561 A | 3/1994 | Nizaka | 365/189.11 |
| 6,055,205 A * | 4/2000 | Rao et al. | 365/230.06 |

FOREIGN PATENT DOCUMENTS

EP 0657890 6/1995 ............ G11C/5/14

* cited by examiner

Primary Examiner—Michael Tokar
Assistant Examiner—Anh Q. Tran
(74) Attorney, Agent, or Firm—Lisa K. Jorgenson; Allen, Dyer, Doppelt, Milbrath & Gilchrist, P.A.

(57) ABSTRACT

An integrated circuit having as power supply voltages a low voltage reference, a logic supply voltage reference and a high voltage reference is provided. The high voltage reference is greater than the low voltage reference and the logic supply voltage reference. The integrated circuit includes an electrically programmable non-volatile memory element, and a selection and programming circuit connected thereto. A voltage control device is connected to a power supply input node of the selection and programming circuit for applying, based upon a programming control signal, the high voltage reference for programming the electrically programmable non-volatile memory element or for applying at least one logic supply voltage reference.

19 Claims, 2 Drawing Sheets

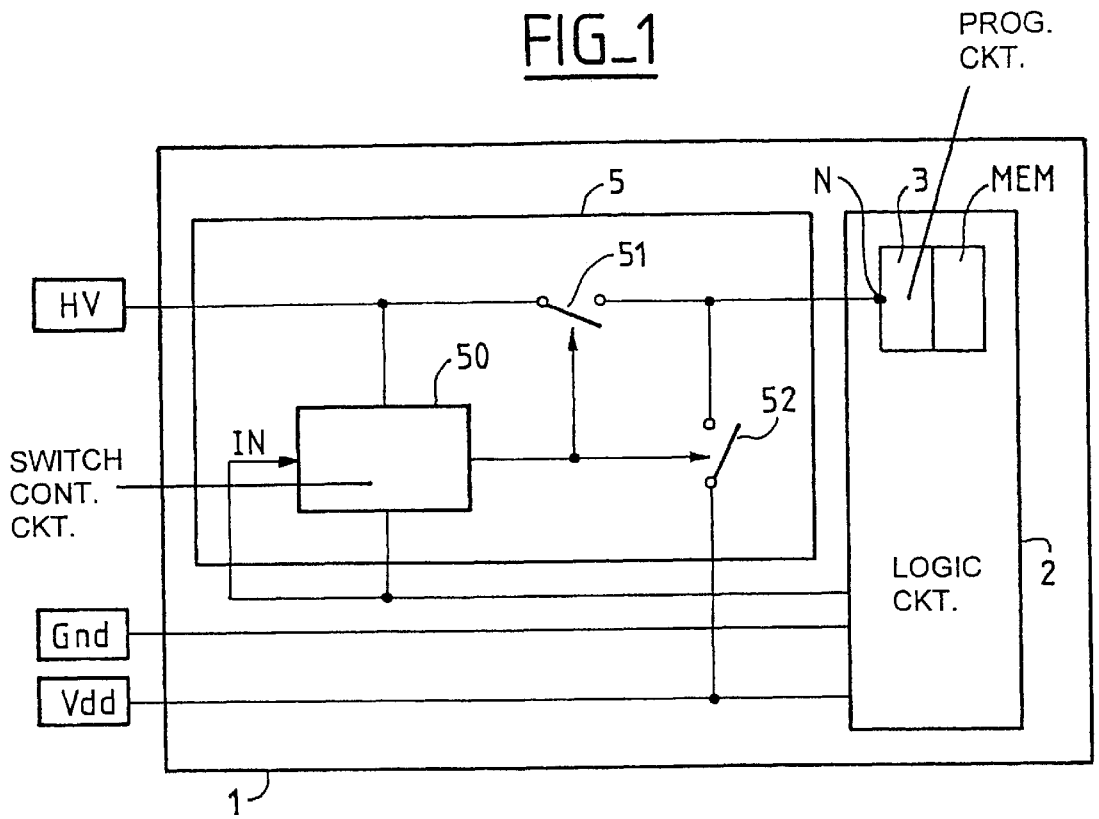
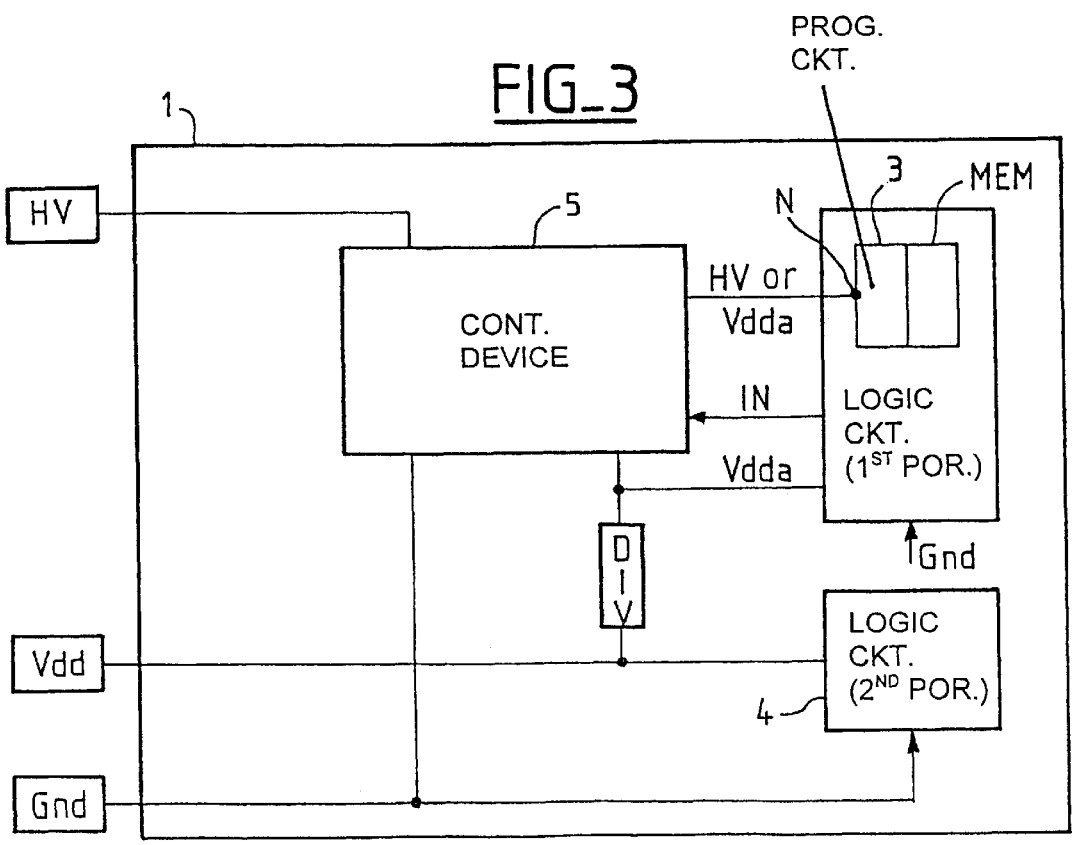

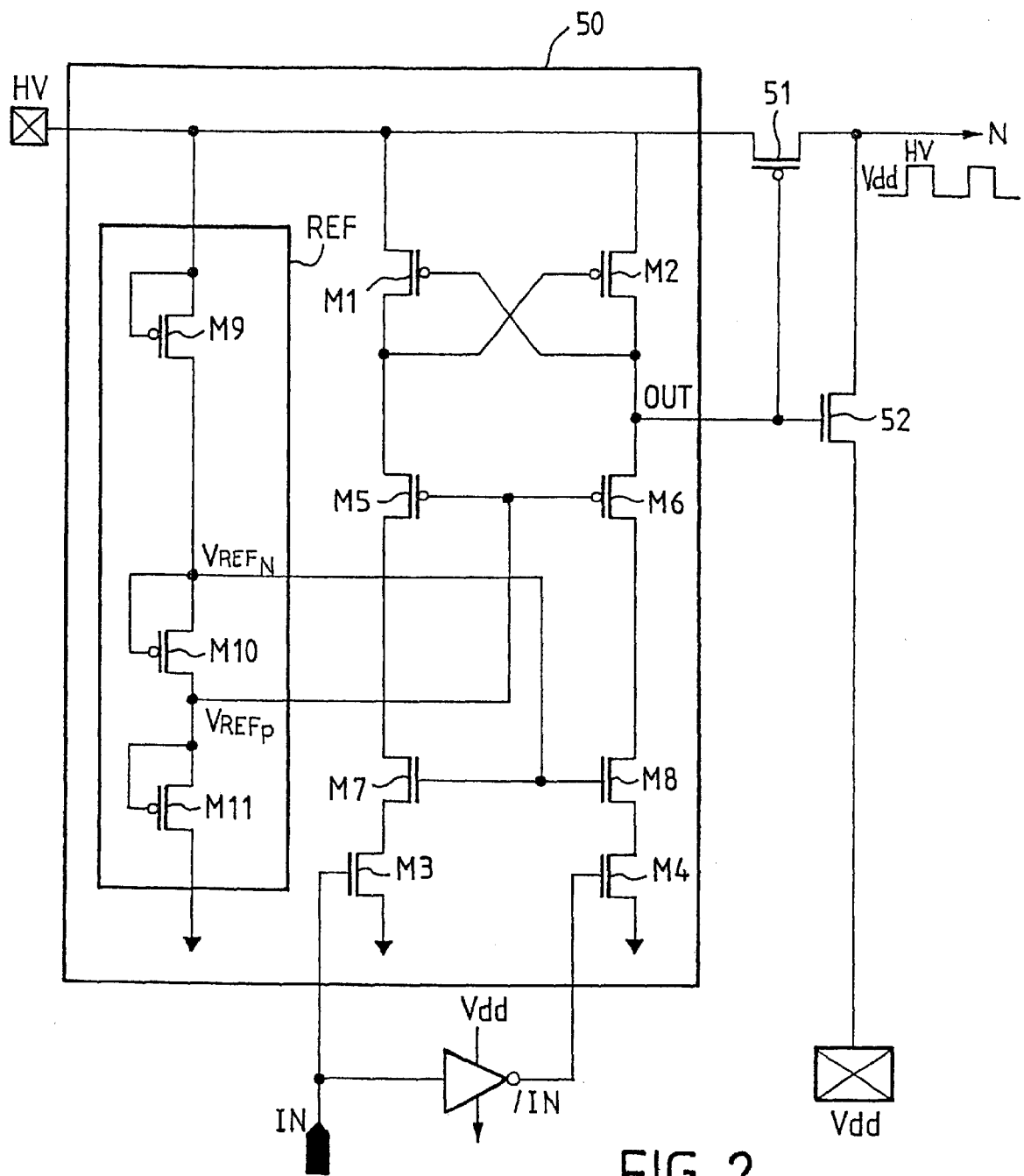
FIG_2
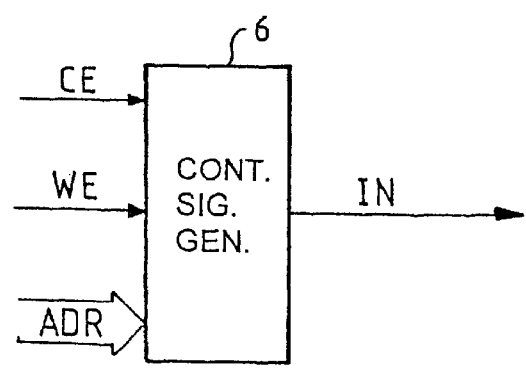
FIG_4

DEVICE TO CONTROL THE POWER SUPPLY IN AN INTEGRATED CIRCUIT COMPRISING ELECTRICALLY PROGRAMMABLE NON-VOLATILE MEMORY ELEMENTS

FIELD OF THE INVENTION

The present invention relates to the field of integrated circuits, and more particularly, to a device for controlling a power supply in an integrated circuit comprising electrically programmable non-volatile memory elements.

BACKGROUND OF THE INVENTION

In the new submicron technologies, the oxide thicknesses are very small, for example 25, 55 or 70 angstroms. An oxide with a thickness of 35 angstroms cannot withstand a voltage over 2 volts. An oxide with a thickness of 55 or 70 angstroms cannot withstand a voltage over 4 volts. Thus, with the new submicron technologies, the integrated circuits receive a lower logic supply voltage at a level optimized to give the best response time in terms of speed while ensuring the reliability of the circuit with protection of the oxides.

In certain integrated circuits, it is possible to have parts of the circuit that use different oxide thicknesses. For improved performance, it may be planned that each part will receive the corresponding optimum supply voltage. It is possible for example to have an integrated circuit with one part that is supplied at 3.3 volts while the other part is supplied at 1.8 volts depending on the thickness of the oxides in each part. Usually, the integrated circuit then receives an external logic supply voltage that is the highest supply level, i.e., 3.3 volts in the example. A voltage divider is provided in the circuit to provide the lowest supply level, 1.8 volts in the example. This divider is such that it is capable of withstanding the highest voltage level.

Integrated circuits based on submicron technologies may comprise an electrically programmable non-volatile memory, such as for example, EEPROM, EPROM, flash EPROM or other similar memories. Memories of this kind use voltage levels, for their programming, that are greater than the logic supply voltages of the integrated circuits. These programming voltage levels depend essentially on the technology considered.

An electrically programmable non-volatile memory element usually comprises at least one floating-gate transistor. The programming of a 0 or a 1 in this element is obtained by the application of appropriate programming voltages to the gate, the drain, the source and the well connection (substrate) of this transistor. In a typical example of an integrated circuit based on submicron technology, the programming voltage levels are 5 volts (drain), 9 volts (gate) and ground (source).

To program these memory elements, it is therefore necessary to have available at least one high voltage that is higher than the logic supply voltages of the integrated circuit. The programming voltage levels needed are produced internally, from this high voltage, by circuitry for the selection and programming of the memory elements. This circuitry includes, for example, a voltage adder or multiplier type circuit.

The integrated circuits typically receive this high voltage permanently at an external pin. Some of the elements of the selection and programming circuitry, and especially their oxides, may receive this high voltage permanently. Depending on the other voltage levels that are applied to them, they may therefore have an excessively high potential at their terminals, and this may be the case frequently or almost permanently. In submicron technologies, the oxides are particularly thin. Even when using the greatest thickness available in the technology considered, it would have to be ensured that each oxide to be protected has a cascode type protection element so that the reliability is not reduced. For reasons of complexity, functionality and cost, an approach of this kind is not satisfactory.

SUMMARY OF THE INVENTION

In view of the foregoing background, an object of the present invention is to improve the reliability of such integrated circuits based on submicron technology, with electrically programmable non-volatile memories, by an overall protection device designed at the level of the high voltage pin.

This and other objects, advantages and features of the present invention are provided by a power supply control device such that the elements of the selection and programming circuit associated with the non-volatile memory elements are powered by the logic power voltage at least outside the programming cycle. With a power control device according to the present invention, the selection and programming circuit associated with the non-volatile memory elements are subjected to programming voltage levels only during the programming cycles. For the remainder of the time, they receive the lower level logic power voltage without in any way endangering the submicron oxides. Thus, the time of exposure to the programming voltage levels is significantly reduced. The reliability of the integrated circuits comprising a power supply control device of this kind is greatly improved.

A power supply control device according to the present invention has two voltage selector switches, one to switch over the high voltage and the other to switch over the logic supply voltage to a power supply input node of the selection and programming circuitry associated with the memory elements. These selection switches are controlled in a complementary way by a voltage level translator connected between the high voltage and ground. This translator is controlled by a binary control signal generated internally by the integrated circuit. The active level of this control signal, used to switch over the high voltage, may correspond to a cycle for writing elements of the non-volatile memory. Outside the writing cycle, this control signal is at its inactive level, which is the supply voltage that is switched over to the input supply node of the selection and programming circuitry.

A cycle for writing memory elements typically comprises, for each programming address, a programming operation followed by a read verification. The write signal remains active only during the time of the write cycle, with read and address changing control signals being used to reduce the time of exposure to the high voltages.

In one embodiment, the level translator is sized so that it can switch over at very high speed, so that it is possible to switch over the high voltage at each change in programming address, to carry out the programming operation at this address and then switch the supply voltage over during the read verification of this programming operation. Thus, the time of exposure to the high voltage is reduced to the maximum.

The invention therefore relates to an integrated circuit comprising electrically programmable non-volatile memory elements and an associated selection and programming circuitry. The integrated circuit includes as supply voltages, a ground reference voltage, at least one logic supply voltage and a high voltage. The high voltage is used to give the voltage levels needed for the programming of one or more non-volatile memory elements. According to the present invention, this integrated circuit furthermore comprises a voltage control device applied to a power input node of the selection and programming circuitry to apply either the high voltage or a logic supply voltage as a function of a programming control signal.

BRIEF DESCRIPTION OF THE DRAWINGS

Other features and advantages of the present invention are described in detail in the following description, given by way of a non-restrictive indication of the invention, with reference to the appended drawings, of which:

FIG. 1 is a block diagram of an integrated circuit based on submicron technology comprising non-volatile memory elements and a power control device according to the present invention;

FIG. 2 is a detailed diagram of an embodiment of the power control device illustrated in FIG. 1;

FIG. 3 is a block diagram of an alternative embodiment of a power control device in an integrated circuit with two logic supply voltages according to the present invention; and FIG. 4 is a diagram of the circuit that generates the control signal for the power control device according to the present invention.

DETAILED DESCRIPTION OF THE PREFERRED EMBODIMENTS

FIG. 1 is a block diagram of an integrated circuit 1 using submicron technology. The integrated circuit 1 receives via external pins a ground reference Gnd, a logic supply voltage Vdd and a high voltage HV. This integrated circuit 1 has logic circuitry 2, which is not shown in detail, that may comprise for example a microprocessor and ROM, RAM or other type memories, as well as an electrically programmable non-volatile memory MEM and an associated selection and programming circuitry 3.

The selection and programming circuitry 3 receives, in addition to the logic supply voltage Vdd and ground Gnd, a voltage applied by a control device 5 according to the present invention to a power input node N. Depending on whether the operation is in a write (or programming) cycle, this node receives the high voltage HV or the logic supply voltage Vdd.

These different voltages enable this selection and programming circuitry 3 to achieve a controlled production and application of the necessary voltage levels to the elements of the memory according to the operation to be performed, i.e., reading and writing of a 0 or a 1, or a reading operation to verify the programming.

The control device 5 according to the present invention is controlled by a binary control signal IN generated internally by the logic circuitry 2. Through the control device 5 the input node N of the selection and programming circuitry 3 is taken to the high voltage HV only during the writing and programming cycles. Outside these cycles, the node N is taken to the logic supply voltage Vdd.

The control device 5 has two selection switches 51 and 52. A first selection switch 51 is connected between the high voltage HV and the power input node N of the selection and programming circuitry 3. A second selection switch 52 is connected between the power supply voltage Vdd and the node N. The two selection switches 51 and 52 are controlled by means 50 in a complementary way so that only one is closed at a given point in time, to apply the associated voltage to the input node N.

The means 50 are, in practice, a level translator capable of providing a binary signal at an output. The two high and low levels of this binary signal corresponds respectively at least to the level of the high voltage HV to be switched over and at most to the level of the logic supply voltage Vdd to be switched over.

An exemplary embodiment of a control device according to the present invention is shown in detail in FIG. 2. The translator 50 is controlled by the binary control signal IN. It is powered between the high voltage HV and ground Gnd. In order that this translator may not be damaged by the high voltage, it must have a protection stage of at least one cascode stage. This protection stage is used to limit the internal nodes of the translator to intermediate voltage levels, so that no transistor of the translator receives an excessively high voltage at its terminals.

In the example shown, the translator 50 has two cascode stages and one circuit REF for the generation of the reference voltages of the cascode stages. Thus, the translator, in each of its two arms, has four series-connected transistors between the high voltage HV and ground. Each arm includes a load transistor connected to the high voltage, a selection switch transistor connected to ground and controlled by the binary control signal or its inverse and two cascode transistors. One of the cascode transistors is to protect the load transistor and the other is to protect the selection switch transistor.

In one exemplary embodiment based on CMOS technology and corresponding to FIG. 2, the selection switch transistors are N-type transistors and have their sources connected to ground. The load transistors are P-type transistors and each of them has its source connected to the high voltage HV and its gate connected to the drain of the load transistor of the other arm.

The first arm thus has, in series between the high voltage and ground a P-type load transistor M1, a P-type cascode transistor M5, an N-type cascode transistor M7 and an N-type selection switch transistor M3. The second arm is similar to the first arm and includes a P-type load transistor M2, a P-type cascode transistor M6, an N-type cascode transistor M8 and an N-type selection switch transistor M4.

The control device 5 has a circuit REF for the generation of reference voltages $V_{REF_N}$ and $V_{REF_P}$ to control the gates of the N-type and P-type cascode transistors. In an exemplary embodiment of this circuit shown in FIG. 3, the circuit REF has three MOS transistors M9, M10, M11 series-connected between the high voltage HV and ground. These three transistors operate as resistors since each of them has its gate connected to its drain. In the example, they are P-type transistors. The reference voltages $V_{REF_N}$ and $V_{REF_P}$ are obtained by taking the voltage on either side of the middle transistor M10.

With these reference voltages, each cascode transistor limits the voltage swings at its terminals. Thus, the source of each P-type cascode transistor cannot fall below $V_{REF_P}+Vt_p$, where $Vt_p$ is the threshold voltage of the P type cascode transistor. Similarly, the source of each N-type cascode transistor cannot rise above $VREF_N-Vt_n$, where $Vt_n$ is the threshold voltage of the N-type cascode transistor.

In the voltage translators, the level of the signal obtained at output of the translator is usually that of the high voltage, namely ground. This is obtained by taking the position at the midpoint of one of the arms, i.e., taking the output between the two cascode transistors of an arm.

In taking the output in one arm, between the load transistor connected to the high voltage and the following cascode transistor, namely between the transistors M2 and M6 in the example, the level of the signal obtained at the output OUT of the translator is either that of the high voltage HV or a level in the range of the logic supply voltage Vdd to be switched. This is what makes it possible to control the two selector switches 51 and 52 without straining their oxides and without any risk of leakage.

The control device furthermore has two selector switches 51 and 52 controlled in a complementary way by the output OUT of the translator 50. In the example, the selector switch 51 is a P-type MOS transistor connected between the high voltage HV and the supply input node N of the selection and programming circuitry 3. The selector switch 52 is an N-type transistor connected between the logic supply voltage Vdd and the supply input node N of the selection and programming circuitry 3.

When the binary control signal IN is at its active level, corresponding in the example to the low state 0, the output OUT should be set at its high level, to turn the selection switch transistor 51 on to switch over the high voltage HV to the node N and turn the selection switch transistor 52 off. When the signal IN is at 0, it is the transistor M4 that is on and draws its drain to ground. The output OUT falls and gets established at its low level, given by $V_{REFp\_}+Vt$. Indeed, the cascode transistors see to it that the level of the output OUT cannot fall below $V_{REFPp\_}$ and $-Vt$.

In order that the transistor 52 may be efficiently turned off, while its drain, connected to the node N, is at the high voltage HV and its source is connected to the logic supply voltage Vdd, it is necessary to apply, to its gate, at most the level of the voltage of its source, namely a maximum of 3.3 volts. In practice, the value of the low level of the output OUT of the translator is obtained by appropriately sizing the transistors of the reference circuit of the cascode transistors. In the example, it is therefore necessary to size the reference circuit so that $V_{REFp\_}+Vt$ is in the range of 3 volts. It will be noted that the substrate effect received by the transistor 52 facilitates turning this transistor 52 off.

When the binary control signal IN is in its inactive state, corresponding in the example to the high state 1, the output OUT should be set up at its low level, to turn the selection switch transistor 52 on to switch over the logic supply voltage Vdd to the node N, and turn the selection switch transistor 51 off. When the signal IN is at 1, it is the transistor M3 that comes on. The output OUT rises and gets set up at HV, namely 5 volts. The transistor 52 is therefore 25 completely on. A voltage slightly greater than its source voltage is sufficient to turn it on. The transistor 51 for its part is off.

In both cases, with IN at a 1 and IN at a 0, the voltage levels applied to the terminals (drain, source, gate) of the transistors 51 and 52 are such that these transistors are never under stress, thus ensuring the reliability of the system.

FIG. 3 shows a variation according to which the integrated circuit uses two logic supply voltages, Vdd and Vdda, that take, for example, the values of 3.3 volts and 1.8 volts. These voltages respectively correspond, at the technological level, to oxides that are thicker in the part 4 that is powered at the highest logic supply voltage (3.3 volts in the example), and to oxides that are thinner in the part that is powered at the lowest logic supply voltage Vdda (1.8 volts in the example). The lowest logic supply voltage may be obtained directly at an external pin or by division of the main logic supply voltage Vdd, corresponding to what is shown in FIG. 3. In the example, we have Vdd=3.3 volts and Vdda=1.8 volts.

In an integrated circuit of this type, the control signal IN of the power supply control device may come from any part of the integrated circuit. If it is given by the circuit powered at the logic supply voltage Vdda, which is 1.8 volts in the example, the two voltage levels of the signal IN are then at 1.8 volts and 0 volts. If it is given by the part powered at the logic supply voltage Vdd, which is 3.3 volts in the example, the two voltage levels of the signal IN are then at 3.3 volts and 0 volts.

The logic supply voltage switched over to the input node N of the selection and programming circuitry 3 may be the logic supply voltage Vdd or the second logic supply voltage Vdda, independently of the logic associated with the control signal IN. The translator of the control device is then adapted to provide, at its output OUT, the levels needed to make the transistors 51 and 52 switch over properly. More specifically, the cascode reference circuit of the translator is then sized to give a low level of the signal OUT that is a level at most equal to Vdda.

FIG. 4 is a diagrammatic view of a circuit 6 for the generation of the control signal IN of the power supply control device according to the invention. In the example, this circuit 6 receives control signals including a selection signal CE, a write signal WE and the address signals ADR.

In its simplest embodiment, when the programming signal WE is activated, WE=0, the signal IN goes to a 0 to control the application of the high voltage at the input node N of the selection and programming circuitry 3. When the signal is not activated and as long as it is not activated (WE=1), it is the logic power supply voltage that is applied, Vdd or Vdda depending on the option chosen.

Through the control and address signals, it is possible to apply the high voltage only during the active programming phase. In this case, the changes in address in the programming phases are performed at low voltage. In this case, the translator 50 has to be sized to obtain a very fast switching time. In this implementation, the application time of the high voltage HV on the supply input node of the selection and programming circuitry 3 is reduced to the necessary minimum. Thus, the integrated circuitry is protected to the maximum against the effects of stress due to high voltage, at low cost for the integrated circuit, since only the control device will permanently receive the high voltage applied to it. The application can be applied especially when the high voltage is applied to the integrated circuit on an external pin, but also when it is given internally by a charge pump type of circuit for example.

The invention is not limited to the special examples of implementation or to the special embodiments described. In particular, there are many practical variations of translators that can be used in the invention. In particular, it is possible more generally to use a translator with MOS transistors, having one or more cascode stages. The cascode stage or the cascode stages may comprise P MOS transistors only or N MOS transistors only.

Finally, the invention can be applied to the programming of EPROM, EEPROM or other types of memory elements organized in a matrix as well as for the programming of discrete, fusible memory elements that are distributed in internal circuits, for example in redundancy circuits.

That which is claimed is:

1. An integrated circuit having as power supply voltages a low voltage reference, at least one logic supply voltage reference and a high voltage reference, with the high voltage reference being greater than the low voltage reference and the at least one logic supply voltage reference, the integrated circuit comprising:

at least one electrically programmable non-volatile memory element;

a selection and programming circuit connected to said at least one electrically programmable non-volatile memory element and comprising a power supply input node; and a voltage control device connected to the power supply input node and comprising a first selection switch transistor for applying the high voltage reference thereto for programming said at least one electrically programmable non-volatile memory element, and a second selection switch transistor for applying the at least one logic supply voltage reference thereto, said first and second selection switch transistors being complementary and each comprising a control terminal for receiving a same programming control signal.

2. An integrated circuit according to claim 1, further comprising a logic circuit comprising a first portion operating at a first voltage and a second portion operating at a second voltage; and wherein the at least one logic supply voltage reference includes a first logic supply voltage for application to said first portion and a second logic supply voltage for application to said second portion.

3. An integrated circuit according to claim 1, wherein said voltage control device further comprises a voltage translator comprising at least one cascode stage, said voltage translator connected between the high voltage reference and the low voltage reference, and controlled by a binary control signal for providing the control signal being applied to said first and second selection switch transistors.

4. An integrated circuit according to claim 3, wherein said at least one cascode stage two arms, with each arm comprising:

a first transistor connected to the high voltage reference;

a second transistor connected to the low voltage reference; and at least one cascode transistor connected between said first and second transistors, with the control signal being taken from one of said two arms between said first transistor and said at least one cascode transistor.

5. An integrated circuit comprising:

at least one programmable memory element;

a programming circuit connected to said at least one programmable memory element and comprising a power supply input node; and a voltage control device connected to the power supply input node and comprising a first selection switch transistor for applying a high voltage reference thereto for programming said at least one programmable memory element, and a second selection switch transistor for applying at least one logic supply voltage reference thereto, said first and second selection switch transistors being complementary and each comprising a control terminal for receiving a same programming control signal, and the at least one logic supply voltage reference being less than the high voltage reference.

6. An integrated circuit according to claim 5, further comprising a logic circuit comprising a first portion operating at a first voltage and a second portion operating at a second voltage; and wherein the at least one logic supply voltage reference includes a first logic supply voltage for application to said first portion and a second logic supply voltage for application to said second portion.

7. An integrated circuit according to claim 5, wherein said voltage control device further comprises a voltage translator comprising at least one cascode stage, said voltage translator connected between the high voltage reference and the low voltage reference, and controlled by a binary control signal for providing the control signal being applied to said first and second selection switch transistors.

8. An integrated circuit according to claim 7, wherein said at least one cascode stage comprises a two arms, with each arm comprising:

a first transistor connected to the high voltage reference;

a second transistor connected to the low voltage reference; and at least one cascode transistor connected between said first and second transistors, with the control signal being taken from one of said two arms between said first transistor and said at least one cascode transistor.

9. An integrated circuit comprising:

at least one programmable memory element;

a programming circuit connected to said at least one programmable memory element and comprising a power supply input node;

a plurality of input pins for receiving as supply voltages a low voltage reference, at least one logic supply voltage reference, and a high voltage reference for programming said at least one programmable memory element, the high voltage reference being greater than the low voltage reference and the at least one logic supply voltage reference; and a voltage control device connected to the power supply input node, and comprising a first selection switch for applying the high voltage reference thereto and a second selection switch for applying the at least one logic supply voltage reference thereto, said first and second selection switches being complementary and each comprising a control terminal for receiving a same control signal.

10. An integrated circuit according to claim 9, wherein the high voltage reference and the at least one logic supply voltage reference are applied based upon a programming control signal.

11. An integrated circuit according to claim 9, wherein said first and second selection switches each comprises a transistor.

12. An integrated circuit according to claim 9, further comprising a logic circuit comprising a first portion operating at a first voltage and a second portion operating at a second voltage; and wherein the at least one logic supply voltage reference includes a first logic supply voltage for application to said first portion and a second logic supply voltage for application to said second portion.

13. An integrated circuit according to claim 9, wherein said voltage control device further comprises a voltage translator comprising at least one cascode stage, said voltage translator connected between the high voltage reference and the low voltage reference, and controlled by a binary control signal for providing the control signal being applied to said first and second selection switches.

14. An integrated circuit according to claim 13, wherein said at least one cascode stage comprises two arms, with each arm comprising:

a first transistor connected to the high voltage reference;

a second transistor connected to the low voltage reference; and at least one cascode transistor connected between said first and second transistors, with the control signal being taken from one of said two arms between said first transistor and said at least one cascode transistor.

15. A method for controlling an integrated circuit comprising at least one programmable memory element, a programming circuit connected to the programmable memory element and including a power supply input node, and a voltage control device comprising first and second selection switches connected to the power supply input node, the method comprising:

applying to the power supply input node, based upon a programming control signal, a high voltage reference via the first selection switch for programming the at least one programmable memory element or at least one logic supply voltage reference via the second selection switch, the first and second selection switches being complementary and each comprising a control terminal for receiving the same programming control signal.

16. A method according to claim 15, wherein the integrated circuit comprises a logic circuit comprising a first portion operating at a first voltage and a second portion operating at a second voltage; and wherein the at least one logic supply voltage reference includes a first logic supply voltage for application to the first portion and a second logic supply voltage for application to the second portion, the at least one logic supply voltage reference being less than the high voltage reference.

17. A method according to claim 15, wherein the first and second selection switches each comprises a transistor.

18. A method according to claim 15, wherein the voltage control device further comprises a voltage translator comprising at least one cascode stage, the voltage translator connected between the high voltage reference and a low voltage reference, and controlled by a binary control signal for providing the control signal being applied to the first and second selection switches.

19. A method according to claim 18, wherein the at least one cascode stage comprises two arms, with each arm comprising:

a first transistor connected to the high voltage reference;

a second transistor connected to the low voltage reference; and at least one cascode transistor connected between said first and second transistors, with the control signal being taken from one of the two arms between the first transistor and the at least one cascode transistor.

* * * * *

UNITED STATES PATENT AND TRADEMARK OFFICE
CERTIFICATE OF CORRECTION

PATENT NO. : 6,498,509 B2
DATED : December 24, 2002
INVENTOR(S) : Fournel

It is certified that error appears in the above-identified patent and that said Letters Patent is hereby corrected as shown below:

Column 5,
Line 31, delete "$V_{REFPp}$" insert -- $V_{REFP\_}$ --
Line 53, delete "25 completely" insert -- completely --

Column 7,
Line 39, insert -- comprises -- between "stage" and "two"

Column 8,
Line 14, delete "a two" insert -- two --

Signed and Sealed this

Twenty-second Day of July, 2003

JAMES E. ROGAN
*Director of the United States Patent and Trademark Office*